United States Patent [19]

Bollard

[11] Patent Number: 4,691,381
[45] Date of Patent: Sep. 1, 1987

[54] RECEIVER FOR AMPLITUDE MODULATED SIGNALS

[75] Inventor: David R. Bollard, Mayfield, England

[73] Assignee: U.S. Philips Corporation, New York, N.Y.

[21] Appl. No.: 722,637

[22] Filed: Apr. 12, 1985

[30] Foreign Application Priority Data

Apr. 30, 1984 [GB] United Kingdom ............... 8411038

[51] Int. Cl.[4] ........................................... H04B 1/16
[52] U.S. Cl. ................................... 455/334; 455/226; 340/347 AD; 328/145; 329/146
[58] Field of Search ............... 455/334, 7, 337, 234, 455/239, 293, 226; 324/77 A, 77 R, 77 F, 132, 57 N; 340/347 AD; 375/94; 329/130–132, 146; 328/145; 358/188

[56] References Cited

U.S. PATENT DOCUMENTS

| | | | |
|---|---|---|---|
| 3,108,224 | 8/1960 | Bradsell | 328/145 |
| 3,408,582 | 10/1968 | Britton, Jr. | 328/145 |
| 3,423,682 | 1/1969 | Cauchois | 328/145 |
| 3,435,353 | 3/1969 | Sauber | 328/145 |
| 3,648,043 | 3/1972 | Caron | 328/145 |
| 3,668,535 | 6/1972 | Lansdowne | 329/146 |
| 3,835,378 | 9/1974 | Edden et al. | 455/234 |
| 4,142,185 | 2/1979 | Gordon | 340/347 AD |
| 4,232,302 | 11/1980 | Jagatich | 340/347 AD |
| 4,350,974 | 9/1982 | Gordon et al. | 340/347 AD |

Primary Examiner—Robert L. Griffin
Assistant Examiner—M. Huseman
Attorney, Agent, or Firm—Thomas A. Briody; Jack Oisher; William J. Streeter

[57] ABSTRACT

A receiver for measuring the amplitude of input amplitude modulated signals over an 80 dBm range and producing a digital output. The amplifier comprises a power splitter to which an input signal is applied via a limiter. First and second video detectors are coupled to the power splitter. In the case of the second video detector, an R.F. linear amplifier is connected in the signal path to provide an overall 40 dB's of gain relative to the input of the first video detector. Each video detector comprises a detector stage whose output is connected to an amplifier chain, each amplifier in the chain having a gain of 10. The outputs of the detector stage and amplifiers are quantized and applied to a logarithmic analog-to-digital converter. The outputs of the respective analog-to-digital converters are applied to a combiner.

9 Claims, 2 Drawing Figures

RECEIVER FOR AMPLITUDE MODULATED SIGNALS

BACKGROUND OF THE INVENTION

The present invention relates to a receiver for amplitude modulated signals, more particularly to a receiver for measuring the amplitude of such signals.

A wide bandwidth amplitude measuring receiver is known which is used to provide a measurement in digital form of a receiver signal in the microwave range of frequencies. This known receiver includes an analog logarithmic amplifier whose output is supplied to an analog-to-digital converter. In practice, it is difficult to make a satisfactory analog logarithmic amplifier because a wideband diode has to be used and this can cause stability problems. Additionally such a diode has difficulty in maintaining its square-law characteristic over the full dynamic range which may be as high as 80 dB. Further disadvantages of this known receiver are that it is bulky, expensive and difficult to apply temperature control.

SUMMARY OF THE INVENTION

An object of the present invention is to provide a compact, less expensive amplitude measuring receiver which does not use an analog logarithmic amplifier.

According to the present invention there is provided a receiver for amplitude modulated signals, comprising an input terminal and a video detector coupled to the input terminal, the video detector including a detector stage, an amplifier chain connected to the detector stage and a logarithmic analog-to-digital converter having a plurality of inputs respectively coupled to outputs of the detector stage and the amplifier chain.

The receiver in accordance with the present invention can be made from integrated circuit elements and consequently is compact, less expensive to make and lends itself to the application of temperature control to provide temperature stability.

In implementing the receiver made in accordance with the present invention, the amplifier chain comprises a plurality of series connected amplifiers. The quantization of the input signal is carried out by dividing the dynamic range of the input signal into equal parts, for example 10 dB, and arranging the gain of each amplifier such that signals in its part of the dynamic range can be quantized in an arrangement of comparators, to each of which a reference voltage derived from a respective tapping of a logarithmic resistive chain is applied; each of said arrangements being substantially identical thereby simplifying their manufacture.

The detector stage includes a diode coupled to an input of an operational amplifier and in order to minimize the effect of drift in the diode which is forward biased, a replica diode is coupled to a second input of the operational amplifier.

The amplifiers of the amplifier chain may conveniently comprise operational amplifiers and each of them has a secondary feedback loop including a diode to provide an external limiting circuit. If internal limiting was applied, then there would be a severe increase in the recovery time in the event of an overload.

In order to increase the sensitivity of the receiver and its measuring range, there may be provided a duplicate video detector for measuring the signal amplitudes in the lower half of the dynamic range of the input signal. In such an embodiment the input signal is applied to a power splitter which has two outputs one coupled to the first mentioned video detector and the other to an R.F. linear amplifier which is connected to the duplicate video detector.

DESCRIPTION OF THE DRAWING

The present invention will now be described, by way of example, with reference to the accompanying drawings wherein.

DESCRIPTION OF THE PREFERRED EMBODIMENT

Figure 1:
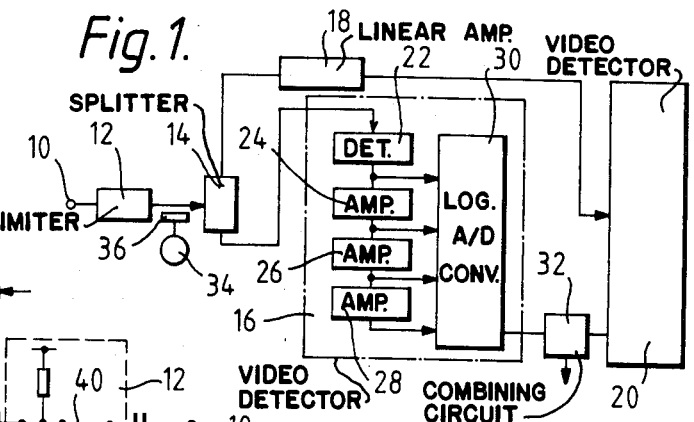
FIG. 1 is a block schematic circuit diagram of an embodiment of the present invention; and, FIG. 2 is a detailed circuit diagram of the embodiment shown in FIG. 1.

The amplitude measuring receiver is adapted to produce as an output digital signal, an indication of the amplitude of the input signal which may have a frequency in the range 400 MHz and 40 GHz. As shown in FIG. 1, an input signal is applied to an input terminal 10 which is coupled via an amplitude limiter circuit 12 to a wide band power splitter 14. In the illustrated embodiment, the sensitivity of the measuring system allows levels between +10 dBm and −70 dBm to be measured. As this amplitude range is large, it is split so that the higher amplitude signals are measured in a first video detector 16 and the lower amplitude signals, after amplification in an R.F. linear amplifier 18, are measured in a second video detector 20 which is identical in construction to the first video detector 16. The digital outputs from the video detectors 16, 20 are combined in a combiner 32 which produces as an output a digital signal representing the value of the amplitude of the signal at the input terminal 10.

The video detector 16 comprises a detector stage 22 and an amplifier chain formed by three series connected amplifier stages 24, 26 and 28 coupled to the detector stage 22. The outputs of the stages 22 to 28 are connected to a logarithmic analog-to-digital converter 30 which includes a latch register and combinational logic circuits. In this embodiment the converter 30 is able to produce a seven bit output. The converter 30 is sampled at a clock rate of 20 MHz.

In order to test the receiver circuit, a "bite" oscillator 34 is coupled by a filter coupler 36 to the line linking the limiter 12 to the power splitter 14. The bite oscillator 34 may comprise a dielectric resonator pulsed oscillator operating near the middle of the band of the signals to be measured. The bite oscillator 34 is operated on demand from a receiver processor (not shown). The limiter 12 includes a switch which will enable the R.F. bite signal to be introduced into the receiver without the risk of resultant radiation out through the input terminal 10.

If a receiver with a lower sensitivity is desired then the power splitter 14, the amplifier 18, the second video detector 20 and the combiner 32 can be omitted.

Figure 2:
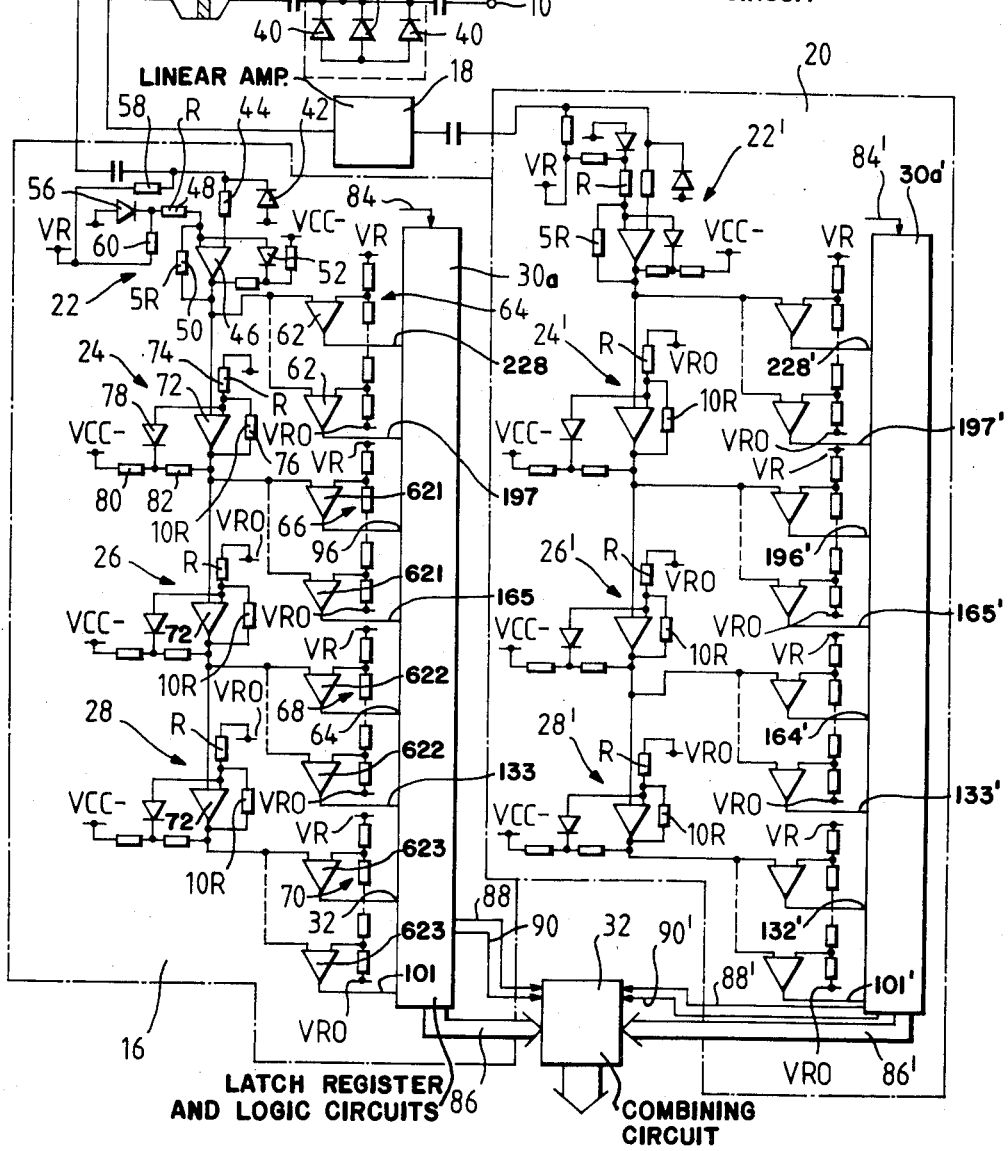

Turning now to FIG. 2, the limiter 12 serves to protect the receiver from excess power signals which, for example, may be radiated by a nearby transmitter. The limiter 12 combines the limiter action with a switch which inhibits radiation when the bite oscillator 34 is operative. The limiter 12 comprises a multiple bus bar switch with a design limit of 1 KW pulse, 10 W means (CW) which is constructed in such a way that it can be operated by a d.c. voltage and thereby constitute an externally controllable switch.

In order to operate the bite oscillator 34, a voltage pulse is applied simultaneously to the oscillator 34 and to diodes 40 in the limiter 12. The pulse closes the limiter 12 and produces a supply voltage to the oscillator 34. The oscillator signal thus generated will be directed into the receiver with little leakage back to an antenna (not shown) via the input terminal 10. In the present embodiment, the bite oscillator output will be a signal of $-10$ dBm for 0.5 $\mu$S with a frequency accuracy of better than 1 in $10^4$.

The wide-band power splitter 14 splits the input signal such that $-6$ dB is directed into the first video detector 16 which, as will be explained, operates between the levels of $+4$ dBm and $-36$ dBm. The remainder of the input signal from the power splitter 14 is applied to the second video detector 20 via the R.F. linear amplifier 18 which has a gain of 36 dB over the appropriate bandwidth. The gain between the inputs to the first and second video detectors 16, 20 is 40 dB. The second video detector 20 is active over the R.F. input signal amplitude range of $-30$ dBm to $-70$ dBm, whereas the first video detector is active over the R.F. input signal amplitude range of $+10$ dBm to $-30$ dBm.

As the two video detectors 16 and 20 are identical only the first one 16 will be described in detail and the corresponding main parts in the second video detector 20 will be indicated with primed reference numerals.

The detector stage 22 comprises a diode 42 connected via a resistor 44 to one input of non-inverting amplifier 46 whose gain is adjusted to equalize the sensitivities in the system. The gain generally lies between 1 and 10 and, in the present embodiment, is taken to be 5. The amplifier 46 is an operational amplifier, such as a Signetics 5539 UHF Operational Amplifier, whose gain is set by resistors 48, 50 having resistance values of R and 5R, respectively. A secondary feedback loop including a diode 52 reduces the gain of the amplifier to 0.5 when the output exceeds $+2$ V, $+2$ V corresponds to a video level of $+10$ dBm R.F. input and 1.001 V at $-30$ dBm R.F. input.

As the detector diode 42 is forward biased, a d.c. level will exist at the diode output, which level will be subject to drift. To minimize the effect of this drift, an exact replica of the diode and bias network is used as the amplifier reference voltage VR. The replica diode is referenced 56 and the bias network comprises resistors 58, 60, the junction of these resistors 58, 60 being connected to a reference voltage VR. The zero signal level voltage is arranged at $+0.2$ volts.

The signal from the detector stage 22 is then digitized by a 7 bit logarithmic analog-to-digital conversion network which includes an analog-to-digital converter 30 clocked at a high frequency of, for example 20 MHz.

In the system being described, the input signal is quantized on the basis of 32 levels for every 10 dB of the input signal. In order that the analog-to-digital converters 30, 30' can operate in their optimum ranges, the signal levels in the most significant 40 dB of the input signal are digitized in the first video detector 16 and signal levels in the least significant 40 dB of the input signal are digitized in the second video detector 20.

In each video detector, the 4 decades of 10 dB are quantized separately by examining the most significant 10 dB, then the next most significant 10 dB, then the third most significant 10 dB, and finally the least significant or fourth most significant 10 dB of the input signal.

Taking the first video detector 16 as an example, the output from the detector stage 22 is applied, respectively, to one input of each of a group of thirty-two comparators 62 in each of which the output is compared with a respective reference voltage derived from a logarithmic resistive chain 64. If the output from the detector stage 22 lies in the first 10 dB decade, then the latch register and combinational logic circuits in block 30a will be set to the digital value of such output.

The output from the detector stage 22 is also supplied to the input of a chain of three series connected identical amplifier stages 24, 26, 28 each having a gain of 10.

Each of the amplifiers 24, 26, 28 comprises an operational amplifier 72, such as a Signetics 5539 UHF Operational Amplifier, having the usual gain determining resistors 74, 76 whose values are in the ratio of R and 10R, respectively, to provide a gain of 10. Additionally a secondary feedback loop including a diode 78 and resistors 80, 82 reduces the gain of the amplifier 12 to less than unity when the output exceeds $+2$ V. By avoiding internal limiting of the amplifier 72, the risk of saturating the amplifier, which will lead to a severe increase of recovery time, is avoided.

As with the first group of thirty-two comparators 62 connected to the output of video detector 16, each of the three further respective groups 621, 622 and 623 of thirty-two comparators have the first inputs thereof coupled to the outputs of the respective operational amplifiers 72 in the respective amplifiers 24, 26 and 28, the other inputs of the comparators in the respective groups being respectively connected to taps on respective logarithmic resistive voltage divider chains 66, 68 and 70. The outputs of the 128 comparators in all four groups are connected to respective inputs 101-228 of the latch register in combinational logic circuit block 30a. In FIG. 2, only the inputs connected to the first and last of the comparators in each of the groups 62, 621, 622 and 623 are illustrated. These are inputs 228 and 197 from group 62, inputs 196 and 165 from group 621, inputs 164 and 133 from groups 622, and inputs 132 and 101 from group 623. By thus amplifying successive logarithmic increments of the signal applied to the successive groups of comparators, the logarithmic resistive voltage divider chains 66, 68 and 70 which provide the respective reference voltages to the respective groups of comparators can all be the same.

In digitizing the input signal, a clock (or sample) pulse is applied to an input 84 of the analog-to-digital converter 30 at the required instant. In the present example, the digital samples are taken every 50 nS (20 MHz) and there are 3 sample periods between the sample time and the latched output. The outputs from each of the analog-to-digital converters 30, 30' comprise a 7 bit parallel output 86, 86', an overflow output 88, 88', and an underflow output 90, 90'. These outputs are coupled to the combiner 32 which comprises two latches each with a tristate output. The signals from the analog-to-digital converters 30, 30' are separately latched and held and the selection of the tristate enable is actioned by the signals on the overflow and underflow lines 88, 88', 90, 90'. Thus if the analog-to-digital converter 30' produces an overflow signal on the line 88' and the analog-to-digital converter 30 shows no underflow then the read-out from the combiner 32 comprises the 7 bits from the converter 30 and a first digit 1 is added to make 8 bits thus indicating that the input signal had an amplitude in the most significant 40 dB. Conversely, if the converter 30 indicates an underflow on the output 90 and the converter 30' shows no overflow, then the 8 bit output from the combiner 32 is the 7 bit output from the converter 30' with the first bit comprising a digital 0 thus indicating that the input signal had an amplitude in the least significant 40 dB.

The construction of the described and illustrated circuit can be based on alumina substrate microwave circuits and alumina substrate thin film techniques which enable a very compact unit to be made and, by being so compact, it is possible to temperature control the entire unit by means of a heater.

I claim:

1. In a receiver for detecting an amplitude modulated signal received at the input thereof and producing a digital output having a digital value corresponding to the amplitude of the detected input signal on a logarithmic scale, a video detector comprising:

a detector stage coupled to the input of said receiver for detecting the received amplitude modulated input signal;

a cascaded chain of amplifiers connected to the output of the detector stage for receiving the detected input signal, said amplifiers respectively having gains which quantize the dynamic range of the amplitude of the detected signal in logarithmic steps;

a plurality of groups of comparators having first inputs and second groups, the first inputs of the comparators in respective groups being respectively connected to the output of the detector stage and to outputs of respective ones of said amplifiers;

and a plurality of logarithmically stepped resistive voltage divider chains respectively corresponding to respective ones of said groups of comparators and each having taps thereon respectively connected to the second inputs of respective comparators in the corresponding group, such taps supplying logarithmically quantized reference voltages to the comparators connected thereto, all of said voltage divider chains and the steps thereon being substantially the same.

2. A receiver as claimed in claim 1, wherein the amplifier chain comprises a series arrangement of n amplifiers of equal gain, where n is at least two.

3. A receiver as claimed in claim 2, wherein the dynamic range of the amplitude modulated signals are quantized in (n+1) equal steps.

4. A receiver as claimed in claim 3, wherein the amplitude modulated signals are quantized in steps of 10 dB and the gain of each of the amplifiers in the amplifier chain is 10.

5. A receiver as claimed in claim 2, 3, or 4 in which each of the n amplifiers comprises an operational amplifier having a secondary feedback loop including a diode to provide an external limiting arrangement.

6. A receiver as claimed in claim 1, wherein the detector stage includes a gain equalizing amplifier having an external limiting arrangement.

7. A receiver as claimed in claim 6, wherein the gain equalizing amplifier is an operational amplifier having first and second inputs, the detector stage further comprising a diode coupled to the first input of the gain equalizing amplifier, and a replica diode coupled to the second input of the gain equalizing amplifier for minimizing the effect of drift in the diode coupled to the first input of the gain equalizing amplifier.

8. A receiver as claimed in claim 1, further comprising a limiter including a switch coupled to the input of said receiver and a bite oscillator operatively coupled to the output of said limiter, whereby when the bite oscillator is pulsed, the switch is actuated to block received signals from being radiated at the input of said receiver.

9. A receiver as claimed in claim 1, further comprising a second video detector, substantially identical to the first mentioned video detector, a power splitter coupled to the signal input terminal, the power splitter having a first output coupled to the first mentioned video detector and a second output coupled to a linear R.F. amplifier which is coupled to the second video detector and a signal combiner coupled to the outputs of the video detectors.

* * * * *

UNITED STATES PATENT AND TRADEMARK OFFICE
CERTIFICATE OF CORRECTION

PATENT NO. : 4,691,381

DATED : September 1, 1987

INVENTOR(S) : DAVID R. BOLLARD

It is certified that error appears in the above-identified patent and that said Letters Patent is hereby corrected as shown below:

In claim 1 line 16 the word "groups" should be --inputs--

Signed and Sealed this

Twenty-ninth Day of November, 1988

*Attest:*

DONALD J. QUIGG

*Attesting Officer*   *Commissioner of Patents and Trademarks*